United States Patent
Takizawa et al.

(10) Patent No.: US 12,072,392 B2
(45) Date of Patent: Aug. 27, 2024

(54) SHORT CIRCUIT DETECTION DEVICE AND SHORT CIRCUIT DETECTION METHOD

(71) Applicant: Mitsubishi Electric Corporation, Tokyo (JP)

(72) Inventors: Yuji Takizawa, Tokyo (JP); Haruyuki Kometani, Tokyo (JP); Kenta Motoyoshi, Tokyo (JP); Atsushi Yamamoto, Tokyo (JP); Susumu Maeda, Tokyo (JP); Nobuaki Muroki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 326 days.

(21) Appl. No.: 17/438,477

(22) PCT Filed: Apr. 12, 2019

(86) PCT No.: PCT/JP2019/015984
§ 371 (c)(1),
(2) Date: Sep. 13, 2021

(87) PCT Pub. No.: WO2020/208812
PCT Pub. Date: Oct. 15, 2020

(65) Prior Publication Data
US 2022/0146593 A1    May 12, 2022

(51) Int. Cl.
*G01R 31/52* (2020.01)
*G01R 31/34* (2020.01)
(Continued)

(52) U.S. Cl.
CPC ........... *G01R 31/52* (2020.01); *G01R 31/343* (2013.01); *H02K 11/26* (2016.01); *H02K 11/27* (2016.01)

(58) Field of Classification Search
CPC ...... G01R 31/343; G01R 31/52; G01R 31/34; H02K 11/26; H02K 11/27; H02K 11/20
See application file for complete search history.

(56) References Cited

U.S. PATENT DOCUMENTS

| | | | |
|---|---|---|---|
| 4,136,312 A | 1/1979 | Salon et al. | |
| 5,006,769 A * | 4/1991 | Posedel | G01R 31/343 361/33 |

(Continued)

FOREIGN PATENT DOCUMENTS

| | | |
|---|---|---|
| JP | 53-84101 A | 7/1978 |
| JP | 58-5682 A | 1/1983 |

(Continued)

OTHER PUBLICATIONS

International Search Report and Written Opinion mailed on Jun. 11, 2019, received for PCT Application PCT/JP2019/015984, Filed on Apr. 12, 2019, 9 pages including English Translation.

*Primary Examiner* — Neel D Shah
*Assistant Examiner* — Adam S Clarke
(74) *Attorney, Agent, or Firm* — XSENSUS LLP

(57) ABSTRACT

Provided is a short-circuit detection device including: a signal acquisition unit configured to acquire, from a magnetic flux detector configured to detect a magnetic flux generated in an air gap between a rotor and a stator of a rotating electric machine, a detection signal corresponding to the magnetic flux; a signal processing unit configured to subject the detection signal acquired by the signal acquisition unit to filtering of removing at least one component of odd-order components included in the detection signal, to thereby generate a filtered signal being the detection signal subjected to the filtering; and a short-circuit detection unit configured to detect a short circuit of a field winding through use of the filtered signal generated by the signal processing unit.

10 Claims, 11 Drawing Sheets

(51) Int. Cl.
  *H02K 11/26* (2016.01)
  *H02K 11/27* (2016.01)

(56) References Cited

U.S. PATENT DOCUMENTS

2004/0090228 A1   5/2004  Goodrich et al.
2022/0320935 A1* 10/2022  Kuznetsov ............... H02K 3/28

FOREIGN PATENT DOCUMENTS

JP      60-167654 A    8/1985
JP      2004-159496 A  6/2004

* cited by examiner

SHORT CIRCUIT DETECTION DEVICE AND SHORT CIRCUIT DETECTION METHOD

CROSS-REFERENCE TO RELATED APPLICATION

The present application is based on PCT filing PCT/JP2019/015984, filed Apr. 12, 2019, the entire contents of which are incorporated herein by reference.

TECHNICAL FIELD

The present invention relates to a short-circuit detection device and a short-circuit detection method for detecting a short circuit of a field winding of a rotating electric machine.

BACKGROUND ART

As a device configured to detect a short circuit of a field winding of a turbine generator being an example of a rotating electric machine, there has been proposed a device configured to detect a change of a field magnetic flux caused by the short circuit of the field winding by means of a magnetic flux detector, for example, a search coil, configured to detect a magnetic flux generated in an air gap between a rotor and a stator (see, for example, Patent Literature 1). Here, in contrast to a sound magnetic pole which is, of two magnetic poles of the rotor, one magnetic pole in which no short circuit has occurred, a short-circuit magnetic pole which is the other magnetic pole in which a short circuit has occurred is reduced in field magnetic flux amount due to reduction of the number of turns of the field winding. The device described in Patent Literature 1 is configured to use such a characteristic to detect this reduction in field magnetic flux amount, to thereby detect the occurrence of the short circuit.

CITATION LIST

Patent Literature

[PTL 1] JP 58-005682 A

SUMMARY OF INVENTION

Technical Problem

In this case, in the search coil aiming to detect the reduction in magnetic flux caused by the short circuit of the field winding, a main magnetic flux interlinks in addition to the field magnetic flux generated in a rotor slot. The main magnetic flux is caused by an interaction between the field magnetic flux and an armature reaction magnetic flux. The field magnetic flux generated in the rotor slot is a leakage magnetic flux flowing between adjacent rotor slots. Such a magnetic flux is hereinafter referred to as "rotor slot leakage magnetic flux."

Accordingly, the magnetic flux reduction amount caused by the short circuit of the field winding is a magnetic flux amount corresponding to one short-circuit turn at most. In contrast, the rotor slot leakage magnetic flux caused by the remaining turns of the field winding is several times thereof corresponding to the number of turns for one slot, and further, the main magnetic flux is several hundred times thereof corresponding to the number of turns obtained by summing up the numbers of turns for several tens of slots. That is, a short-circuit signal and a noise signal which is several ten times to several hundred times of the short-circuit signal are superimposed on a search coil voltage signal. Accordingly, an accuracy of detecting the short circuit of the field winding may be degraded depending on a condition of the rotating electric machine.

The present invention has been made to solve the above-mentioned problems, and has an object to provide a short-circuit detection device and a short-circuit detection method with which a short circuit of a field winding can be detected with high accuracy.

Solution to Problem

According to one embodiment of the present invention, there is provided a short-circuit detection device including: a signal acquisition unit configured to acquire, from a magnetic flux detector configured to detect a magnetic flux generated in an air gap between a rotor and a stator of a rotating electric machine, a detection signal corresponding to the magnetic flux; a signal processing unit configured to subject the detection signal acquired by the signal acquisition unit to filtering of removing at least one component of odd-order components included in the detection signal, to thereby generate a filtered signal being the detection signal subjected to the filtering; and a short-circuit detection unit configured to detect a short circuit of a field winding of the rotating electric machine through use of the filtered signal generated by the signal processing unit.

According to one embodiment of the present invention, there is provided a short-circuit detection method including: a signal acquisition step of acquiring, from a magnetic flux detector configured to detect a magnetic flux generated in an air gap between a rotor and a stator of a rotating electric machine, a detection signal corresponding to the magnetic flux; a signal processing step of subjecting the detection signal acquired in the signal acquisition step to filtering of removing at least one component of odd-order components included in the detection signal, to thereby generate a filtered signal being the detection signal subjected to the filtering; and a short-circuit detection step of detecting a short circuit of a field winding of the rotating electric machine through use of the filtered signal generated in the signal processing step.

Advantageous Effects of Invention

According to the present invention, it is possible to provide the short-circuit detection device and the short-circuit detection method with which the short circuit of the field winding can be detected with high accuracy.

DESCRIPTION OF EMBODIMENTS

Now, a short-circuit detection device and a short-circuit detection method according to each of preferred embodiments of the present invention are described with reference to the accompanying drawings. In the illustration of the drawings, the same components are denoted by the same reference symbols, and the overlapping description thereof is herein omitted.

First Embodiment

Figure 1:
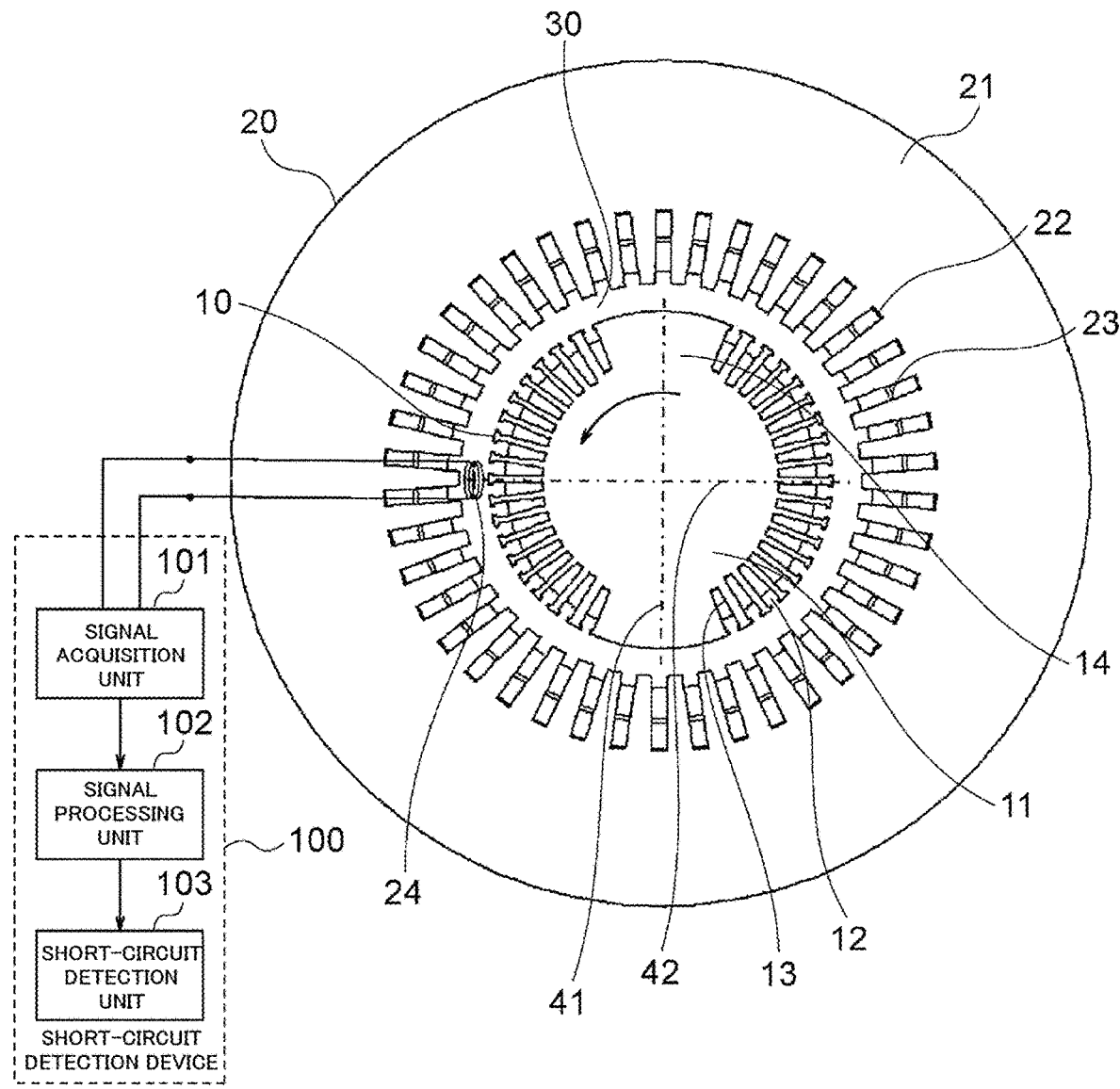
FIG. 1 is a configuration view for illustrating a turbine generator to which a short-circuit detection device according to a first embodiment of the present invention is applied.

FIG. 1 is a configuration view for illustrating a turbine generator to which a short-circuit detection device according to a first embodiment of the present invention is applied. In FIG. 1, a configuration as viewed along an axial direction of a rotating electric machine being an application target of the short-circuit detection device is illustrated together. In the first embodiment, a turbine generator is exemplified as the rotating electric machine.

First, the configuration of the turbine generator is described. As illustrated in FIG. 1, the turbine generator includes a rotor 10 and a stator 20. The rotor 10 is provided so as to be freely rotatable. The stator 20 is provided on an outer side of the rotor 10. An outer peripheral portion of the rotor 10 and an inner peripheral portion of the stator 20 are opposed to each other via an air gap 30. In a rotor core 11 of the rotor 10, a plurality of rotor slots 12 are formed. A series-connected field winding 13 is wound in the plurality of rotor slots 12.

The field winding 13 is subjected to DC excitation from an external power supply so that the rotor core 11 is magnetized into two poles. In this manner, in the rotor core 11, two magnetic poles 14 are formed. In FIG. 1, a magnetic pole center direction 41 and an inter-pole center direction 42 are illustrated. The magnetic pole center direction 41 passes through a center axis of the rotor 10 and a center of each magnetic pole 14. The inter-pole center direction 42 passes through the center axis of the rotor 10 and a center between the two magnetic poles 14 adjacent to each other in a circumferential direction.

In a stator core 21 of the stator 20, a plurality of stator slots 22 are formed. A multi-phase winding 23 is wound in the plurality of stator slots 22. The multi-phase winding 23 is subjected to AC excitation so that a rotation magnetic field is caused in the air gap 30. The turbine generator illustrated in FIG. 1 is a two-pole generator having thirty-six rotor slots 12 and forty-two stator slots 22. The arrow in the counter-clockwise direction of FIG. 1 indicates a rotating direction of the rotor 10.

Figure 2:
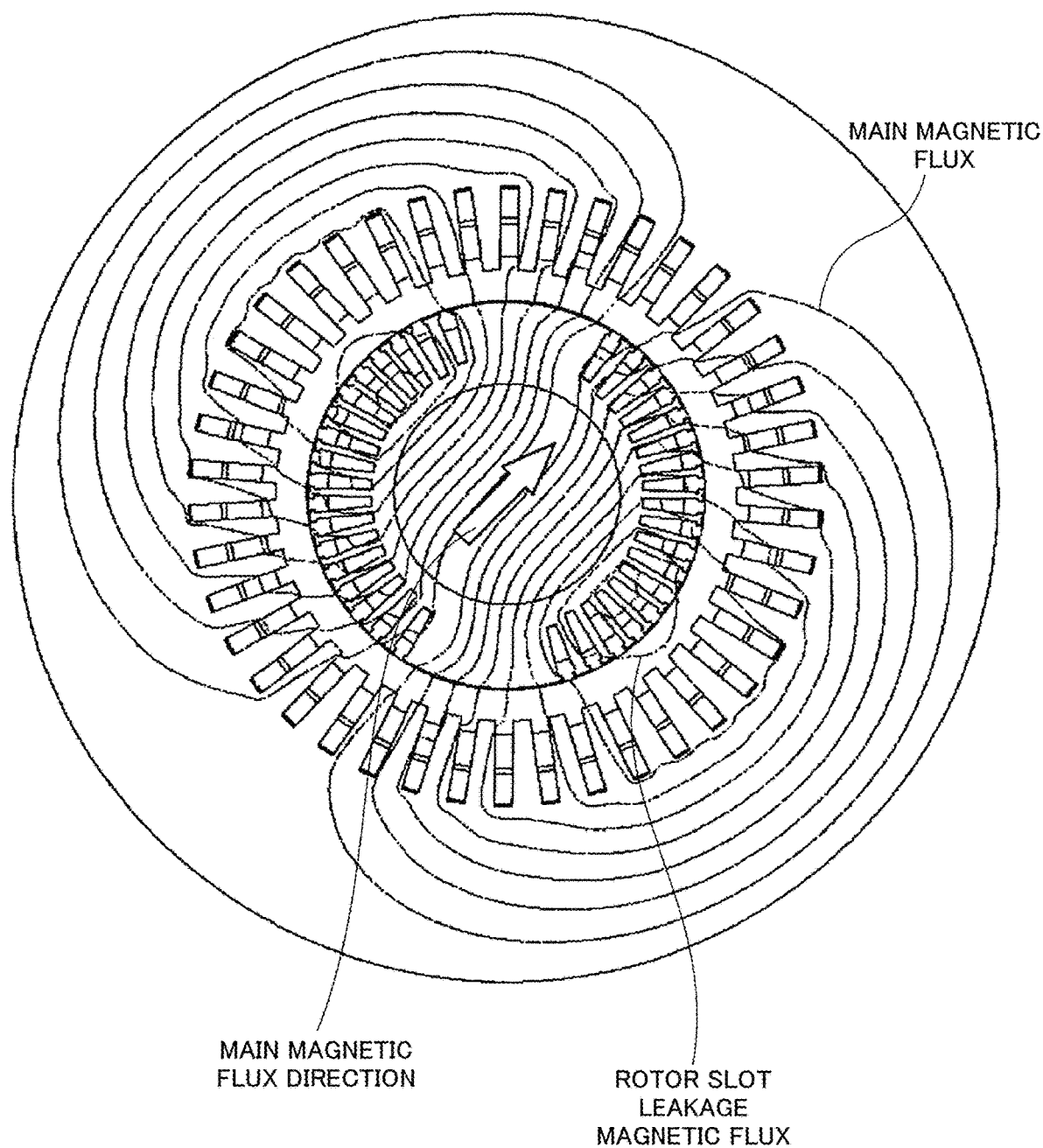
FIG. 2 is a view of magnetic flux lines for illustrating an example of a magnetic flux distribution to be caused in an air gap of the turbine generator in the first embodiment of the present invention.

Now, with reference to FIG. 2, description is given of a state of magnetic flux to be generated in the air gap 30 of the turbine generator in a case in which an operation condition of the turbine generator is a rated load condition to be described later. FIG. 2 is a view of magnetic flux lines for illustrating an example of a magnetic flux distribution to be caused in the air gap 30 of the turbine generator in the first embodiment of the present invention. The arrow of FIG. 2 indicates a main magnetic flux direction which is a direction of main magnetic fluxes to be described later. In FIG. 2, reference symbols are not shown so that the state of the magnetic flux can easily be seen.

As illustrated in FIG. 2, in the air gap 30, there are mainly main magnetic fluxes which are formed of field magnetic fluxes excited by the field winding 13 and armature reaction magnetic fluxes excited by the multi-phase winding 23. The field magnetic flux is a relatively high-frequency magnetic flux which is generated in the rotor slot 12, and moves relative to a search coil 24. The armature reaction magnetic flux is a relatively low-frequency magnetic flux which is generated in the multi-phase winding 23, and does not move relative to the search coil 24. The main magnetic flux flows between the rotor 10 and the stator 20. Further, at positions in the air gap 30 separated away in the circumferential direction with respect to the main magnetic flux direction, there are mainly rotor slot leakage magnetic fluxes. The rotor slot leakage magnetic flux leaks and flows around the rotor slot 12 without interlinking with the stator core 21. The magnetic fluxes around the rotor 10 are roughly divided into those two magnetic fluxes of the main magnetic flux and the rotor slot leakage magnetic flux.

Referring back to the description of FIG. 1, the search coil 24 is fixed to a part of the stator 20 facing the air gap 30. The search coil 24 is provided as a magnetic detector configured to detect a magnetic flux in a radial direction, which is generated in the air gap 30 between the rotor 10 and the stator 20 of the turbine generator. The main magnetic flux and the rotor slot leakage magnetic flux generated in the air gap 30 interlink with the search coil 24. Accordingly, a voltage corresponding to the magnetic fluxes interlinking with the search coil 24 is generated between terminals at both ends of the search coil 24. The distribution of the magnetic fluxes interlinking with the search coil 24 varies along with the rotation of the rotor 10. Accordingly, a search coil voltage signal corresponding to the interlinking magnetic flux amount is output from the search coil 24 in accordance with a rotational angle of the rotor 10.

A short-circuit detection device 100 is connected to the search coil 24. The short-circuit detection device 100 includes a signal acquisition unit 101, a signal processing unit 102, and a short-circuit detection unit 103. The signal acquisition unit 101 is configured to acquire the search coil voltage signal from the search coil 24 as a detection signal. The signal processing unit 102 is configured to subject the detection signal acquired by the signal acquisition unit 101 to high-frequency filtering to be described later, to thereby generate and output a filtered signal. The short-circuit detection unit 103 is configured to calculate a waveform of a difference between the filtered signal output by the signal processing unit 102 and the filtered signal in a sound state stored in advance, and detect the short circuit of the field winding 13 from the calculated waveform of the difference.

Figure 3:
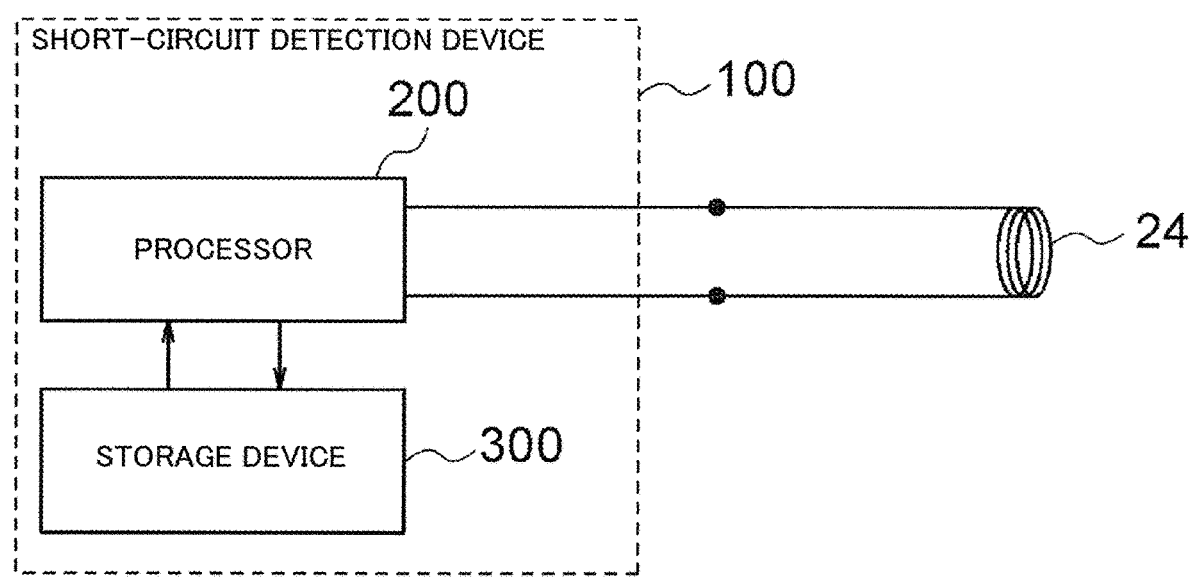
FIG. 3 is a configuration diagram for illustrating an example of a hardware configuration of the short-circuit detection device according to the first embodiment of the present invention.

As a hardware configuration of the short-circuit detection device 100 according to the first embodiment, for example, a configuration illustrated in FIG. 3 can be given. FIG. 3 is a configuration diagram for illustrating an example of the hardware configuration of the short-circuit detection device according to the first embodiment of the present invention.

As illustrated in FIG. 3, the short-circuit detection device 100 includes, as the hardware configuration, a processor 200 and a storage device 300. The processor 200 is configured to execute a program stored in the storage device 300, to thereby implement functions of the above-mentioned short-circuit detection device 100. The storage device 300 is formed of a memory having stored therein a program or the like in which processing corresponding to the functions of the above-mentioned short-circuit detection device 100 is written. The processor 200 is formed of a processor logically configured by a hardware circuit such as a microcomputer, a digital signal processor (DSP), or an FPGA. A plurality of processors 200 and a plurality of storage devices 300 may cooperate with each other to implement the functions of the above-mentioned short-circuit detection device 100.

Figure 4:
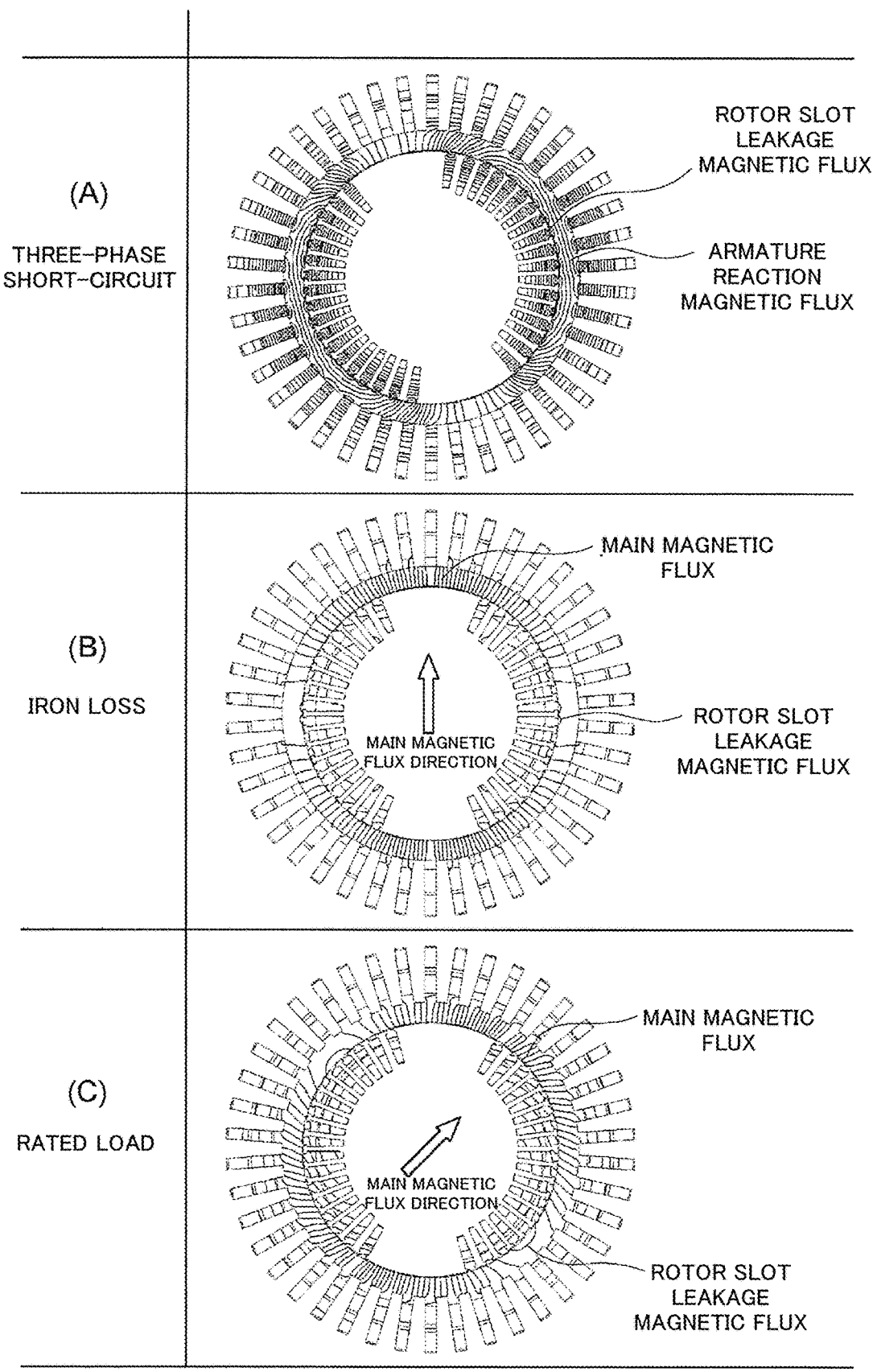
FIG. 4 shows views of magnetic flux lines for illustrating examples of the magnetic flux distribution depending on various operation conditions of the turbine generator in the first embodiment of the present invention.

Next, with reference to FIG. 4, description is given of a difference in magnetic flux distribution depending on various operation conditions of the turbine generator to be caused in the air gap 30 of the turbine generator of FIG. 1. FIG. 4 shows views of magnetic flux lines for illustrating examples of the magnetic flux distribution depending on various operation conditions of the turbine generator in the first embodiment of the present invention. The views of magnetic flux lines of FIG. 4 are obtained through analysis by electromagnetic field analysis.

A view in the upper stage of FIG. 4 is a view of magnetic flux lines for illustrating an example of the magnetic flux distribution to be caused in the air gap 30 in a case in which the operation condition of the turbine generator is a three-phase short-circuit condition. A view in the middle stage of FIG. 4 is a view of magnetic flux lines for illustrating an example of the magnetic flux distribution to be caused in the air gap 30 in a case in which the operation condition of the turbine generator is an iron loss condition. A view in the lower stage of FIG. 4 is a view of magnetic flux lines for illustrating an example of the magnetic flux distribution to be caused in the air gap 30 in a case in which the operation condition of the turbine generator is the rated load condition.

The three-phase short-circuit condition is a condition in which a voltage generated between the terminals of the multi-phase winding 23 is zero, and a rated current flows through the multi-phase winding 23. As can be understood from FIG. 4, the armature reaction magnetic fluxes are excited so as to cancel the field magnetic fluxes, and the rotor slot leakage magnetic fluxes are dominant as a type of the magnetic fluxes generated in the air gap 30.

The iron loss condition is a condition in which a current flowing through the multi-phase winding 23 is zero, and a rated voltage is generated between the terminals of the multi-phase winding 23. As can be understood from FIG. 4, the armature reaction magnetic flux is zero, and hence the field magnetic fluxes as the main magnetic fluxes in which the magnetic flux direction is the magnetic pole center direction 41 are dominant as the type of the magnetic fluxes generated in the air gap 30. At positions of the air gap 30 separated away by 90 degrees in the circumferential direction with respect to the magnetic pole center direction 41, the rotor slot leakage magnetic fluxes are dominant.

The rated load condition is a condition in which a rated voltage is generated between the terminals of the multi-phase winding 23, and a rated current flows through the multi-phase winding 23. As can be understood from FIG. 4, at positions of the air gap 30 separated away by angles corresponding to a power factor angle and an internal phase angle in the circumferential direction with respect to the magnetic pole center direction 41, main magnetic fluxes formed of the field magnetic fluxes and the armature reaction magnetic fluxes are generated. At those positions of the air gap 30, the main magnetic fluxes are dominant. Further, at positions of the air gap 30 greatly separated away in the circumferential direction with respect to the magnetic pole center direction 41, the rotor slot leakage magnetic fluxes are dominant.

As can be understood from FIG. 4 referred to above, in the operation conditions other than the three-phase short-circuit condition, that is, the iron loss condition and the rated load condition, the magnetic flux distribution of the air gap 30 is in the following state. That is, the main magnetic fluxes occupy the majority and are dominant, and the rotor slot leakage magnetic fluxes are dominant only in parts in the vicinity of angles greatly separated away in the circumferential direction with respect to the main magnetic flux direction.

Figure 5:
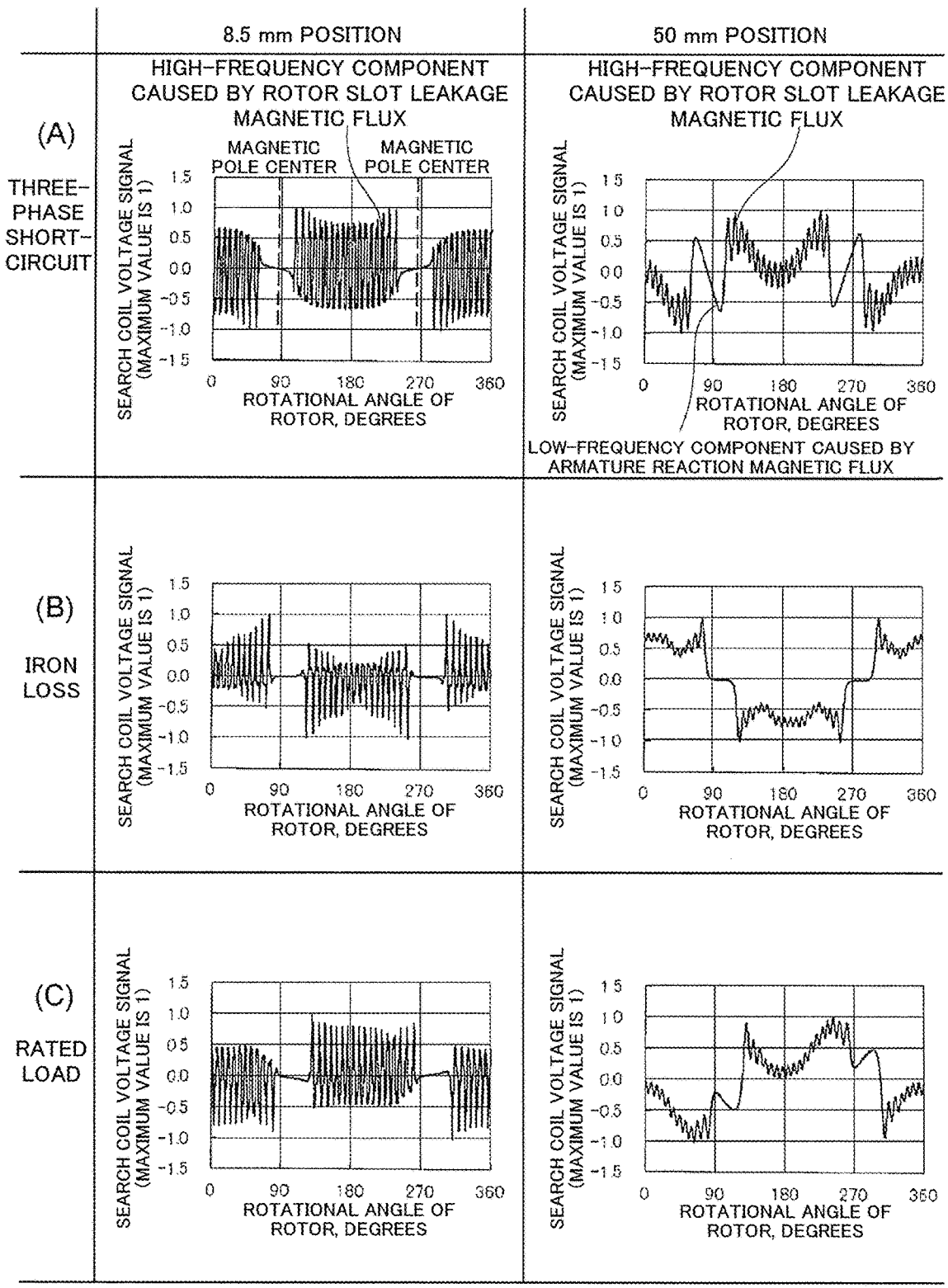
FIG. 5 shows waveform charts for illustrating examples of a search coil voltage signal to be detected depending on various operation conditions of the turbine generator in the first embodiment of the present invention.

Next, with reference to FIG. 5, description is given of examples of the search coil voltage signal to be detected by the search coil 24. FIG. 5 shows waveform charts for illustrating examples of the search coil voltage signal to be detected depending on various operation conditions of the turbine generator in the first embodiment of the present invention. In each graph shown in FIG. 5, the horizontal axis represents the rotational angle of the rotor 10, and the vertical axis represents the search coil voltage signal. Further, signals of FIG. 5 and each figure to be described later can be obtained through analysis by electromagnetic field analysis.

FIG. 5 shows a waveform of the search coil voltage signal to be detected in a case in which the search coil 24 is arranged at a position separated away by 8.5 mm in the radial direction from a rotor surface being a surface of the rotor 10, and a waveform of the search coil voltage signal to be detected in a case in which the search coil 24 is separated away by 50 mm in the radial direction from the rotor surface. Further, FIG. 5 shows the waveform of the search coil voltage signal with the operation condition of the turbine generator being divided into each of the three-phase short-circuit condition, the iron loss condition, and the rated load condition described above.

As can be understood from FIG. 5, in the case in which the search coil 24 is arranged close to the rotor surface, that is, in the case in which the search coil 24 is arranged at the position separated away by 8.5 mm in the radial direction from the rotor surface, large high-frequency variations are caused by the rotor slot leakage magnetic fluxes. Meanwhile, in the case in which the search coil 24 is arranged far from the rotor surface and close to the stator surface, that is, in the case in which the search coil 24 is separated away by 50 mm in the radial direction from the rotor surface, large low-frequency variations are caused by the armature reaction magnetic fluxes.

Figure 6:
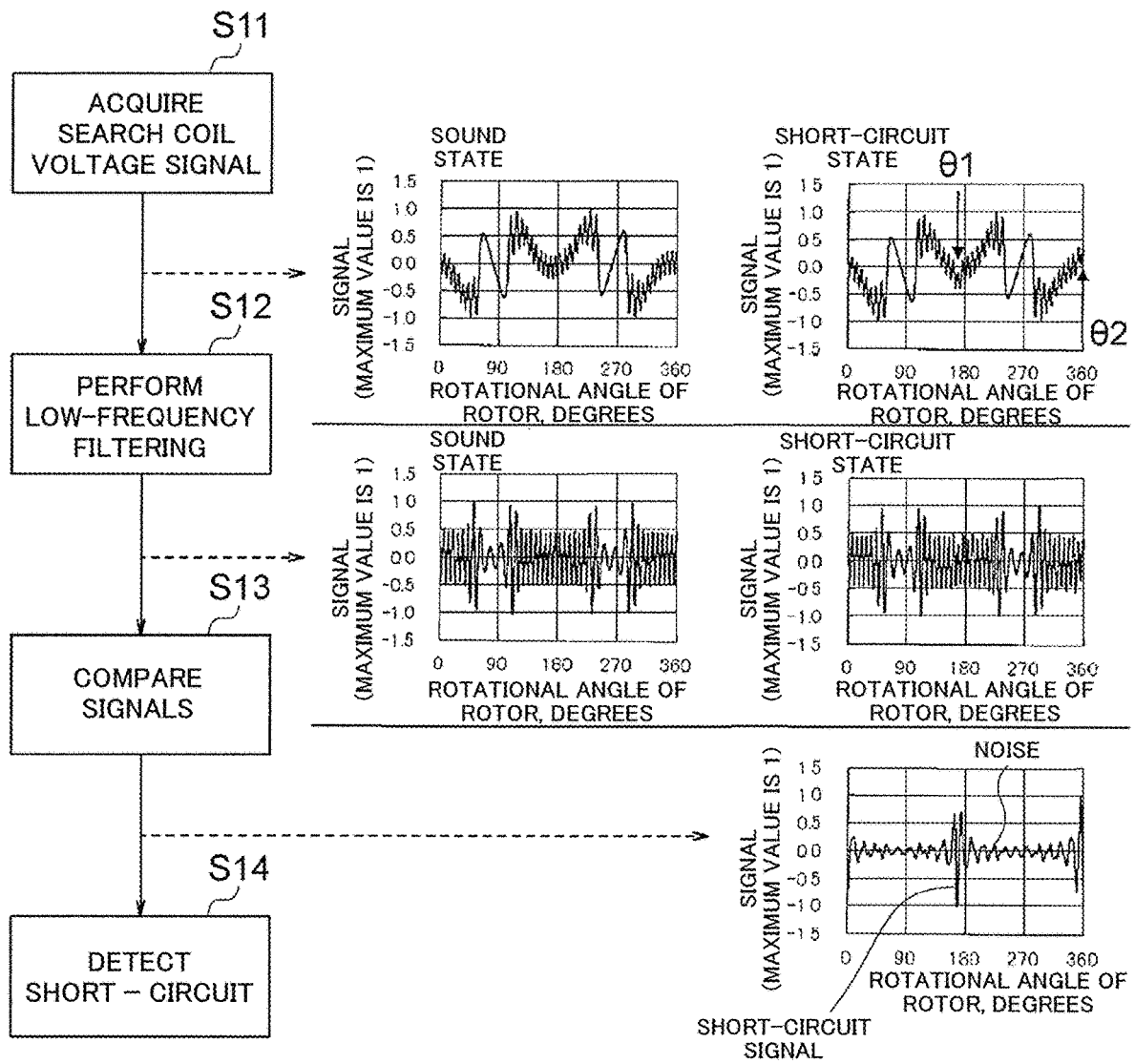
FIG. 6 is a flow chart for illustrating short-circuit detection processing in Comparative Example.
Figure 7:
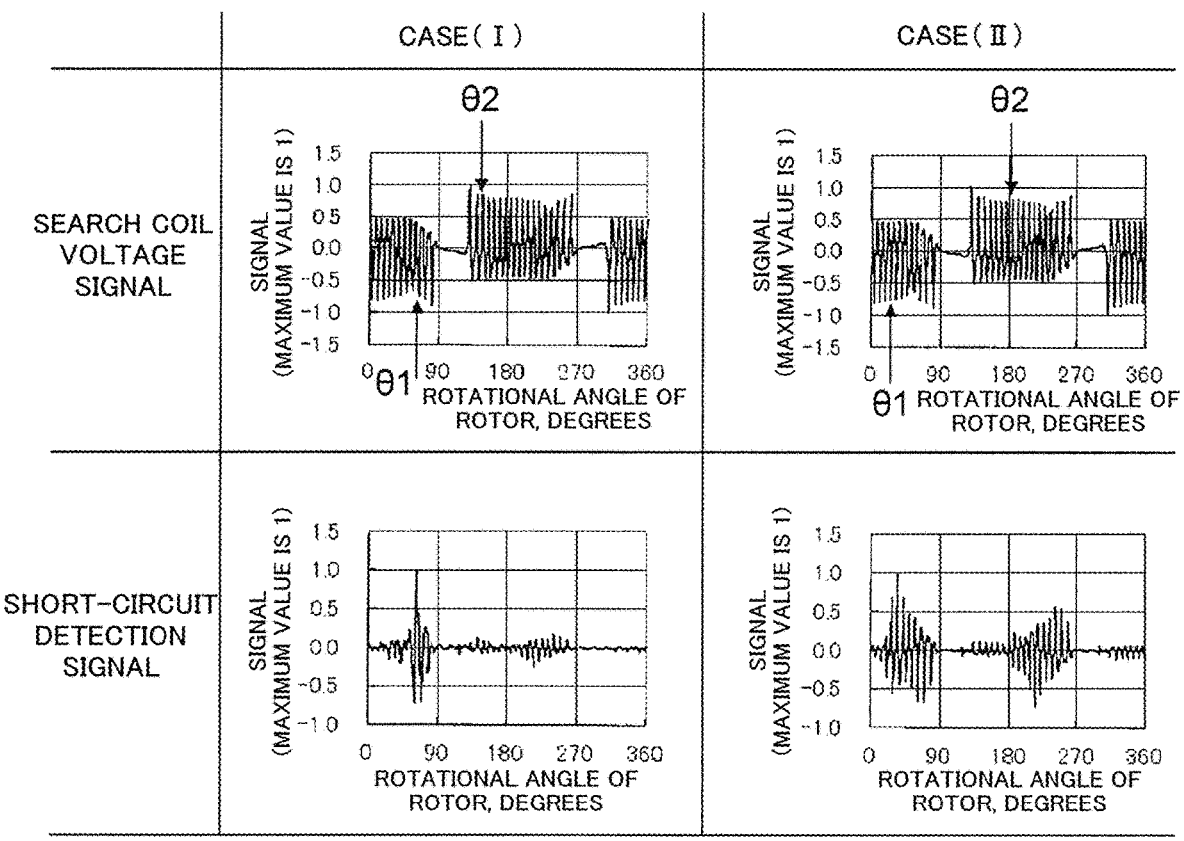
FIG. 7 shows waveform charts for illustrating the search coil voltage signal and a short-circuit detection signal to be obtained by the short-circuit detection processing in Comparative Example.

Next, with reference to FIG. 6 and FIG. 7, description is given of short-circuit detection processing in Comparative Example. FIG. 6 is a flow chart for illustrating the short-circuit detection processing in Comparative Example. In FIG. 6, examples of waveforms of the search coil voltage signals obtained after the processing of respective steps are illustrated together. Further, FIG. 6 shows each of a search coil voltage signal corresponding to a sound state in which no short circuit has occurred in the field winding 13, and a search coil voltage signal corresponding to a short-circuit state in which a short circuit has occurred in the field winding 13. Further, it is assumed that a short circuit corresponding to one turn of the field winding 13 has occurred in the rotor slot 12 corresponding to each of a rotational angle θ1 and a rotational angle θ2.

As illustrated in FIG. 6, in Step S11, the search coil voltage signal is acquired from the search coil 24 as the detection signal. After that, the processing proceeds to Step S12.

In Step S12, the search coil voltage signal acquired in Step S11 is subjected to low-frequency filtering of cutting low frequencies caused by the armature reaction magnetic fluxes. Subsequently, the search coil voltage signal subjected to the low-frequency filtering is output as a filtered signal. As a filter for performing the low-frequency filtering, a low-frequency filter designed so as to cut the low frequencies caused by the armature reaction magnetic fluxes is used. After that, the processing proceeds to Step S13.

In Step S13, a short-circuit detection signal is generated by subtracting the filtered signal in the sound state from the filtered signal output in Step S12, and this short-circuit detection signal is output. After that, the processing proceeds to Step S14.

In Step S14, the occurrence of the short circuit and the position of the rotor slot 12 at which the short circuit has occurred are detected based on the feature of a peak or the like appearing in the short-circuit detection signal output in Step S13. After that, the processing is ended.

Next, with reference to FIG. 7, description is given of the search coil voltage signal and the short-circuit detection signal which change depending on the position of the rotor slot 12 in which the short circuit has occurred. FIG. 7 shows waveform charts for illustrating the search coil voltage signal and the short-circuit detection signal to be obtained by the short-circuit detection processing in Comparative Example.

FIG. 7 shows examples of the search coil voltage signal and the short-circuit detection signal to be obtained in each of a case (I) in which a short circuit has occurred in a rotor slot 12 present in a direction in which the main magnetic fluxes are smaller than the rotor slot leakage magnetic fluxes, and a case (II) in which a short circuit has occurred in a rotor slot 12 close to the main magnetic flux direction. Further, the search coil voltage signal and the short-circuit detection signal to be obtained in each case can be obtained when the operation condition of the turbine generator is the rated load condition.

Further, as a condition of the low-frequency filtering to be performed on the search coil voltage signal, there is adopted a condition in which components of the rotor slot leakage magnetic fluxes included in the search coil voltage signal are sufficiently cut. Specifically, as the condition of the low-frequency filtering, there is adopted a condition in which a 24th order component and components having lower orders of the search coil voltage signal are cut. The number "24" given as a specific numerical example of the order of the filter is a numerical value selected for convenience so that rotor slot order components included in the search coil voltage signal can be sufficiently cut.

The search coil voltage signal mainly includes components caused by the armature reaction magnetic fluxes, and the rotor slot order components which are components caused by the rotor slot leakage magnetic fluxes. The components caused by armature reaction magnetic fluxes include a first-order component. The rotor slot order components are also called orders of space harmonics of the rotor slots 12. The rotor slot order components include a 47th order component and a 49th order component. The above-mentioned condition is determined in consideration of such points. The numbers "47" and "49" exemplified as specific numerical values are values uniquely determined by the specification of the rotor 10. The n-th order (n=1, 2, . . . ) herein is a component which varies "n" times in the horizontal axis of FIG. 7, that is, for one rotation of the rotor. For example, the first order is an order of a component which varies one time for one rotation of the rotor.

In the case (I) illustrated in FIG. 7, in the vicinity of the value of 220 degrees in the horizontal axis, the short-circuit detection signal is hidden in the noise signal. Also in the case (II), similarly to the case (I), the short-circuit detection signal is hidden in the noise signal, and it is understood that the short-circuit detection signal and the noise signal cannot be clearly distinguished from each other.

The results illustrated in FIG. 7 are analysis results as described above, but even in actual measurement, harmonic noise caused by an ambient environment is superimposed on the search coil voltage signal and the short-circuit detection signal. Accordingly, in the short-circuit detection processing in Comparative Example, the short-circuit detection signal and the noise signal cannot be clearly distinguished from each other, and there is a fear in that a short circuit is erroneously detected.

Figure 8:
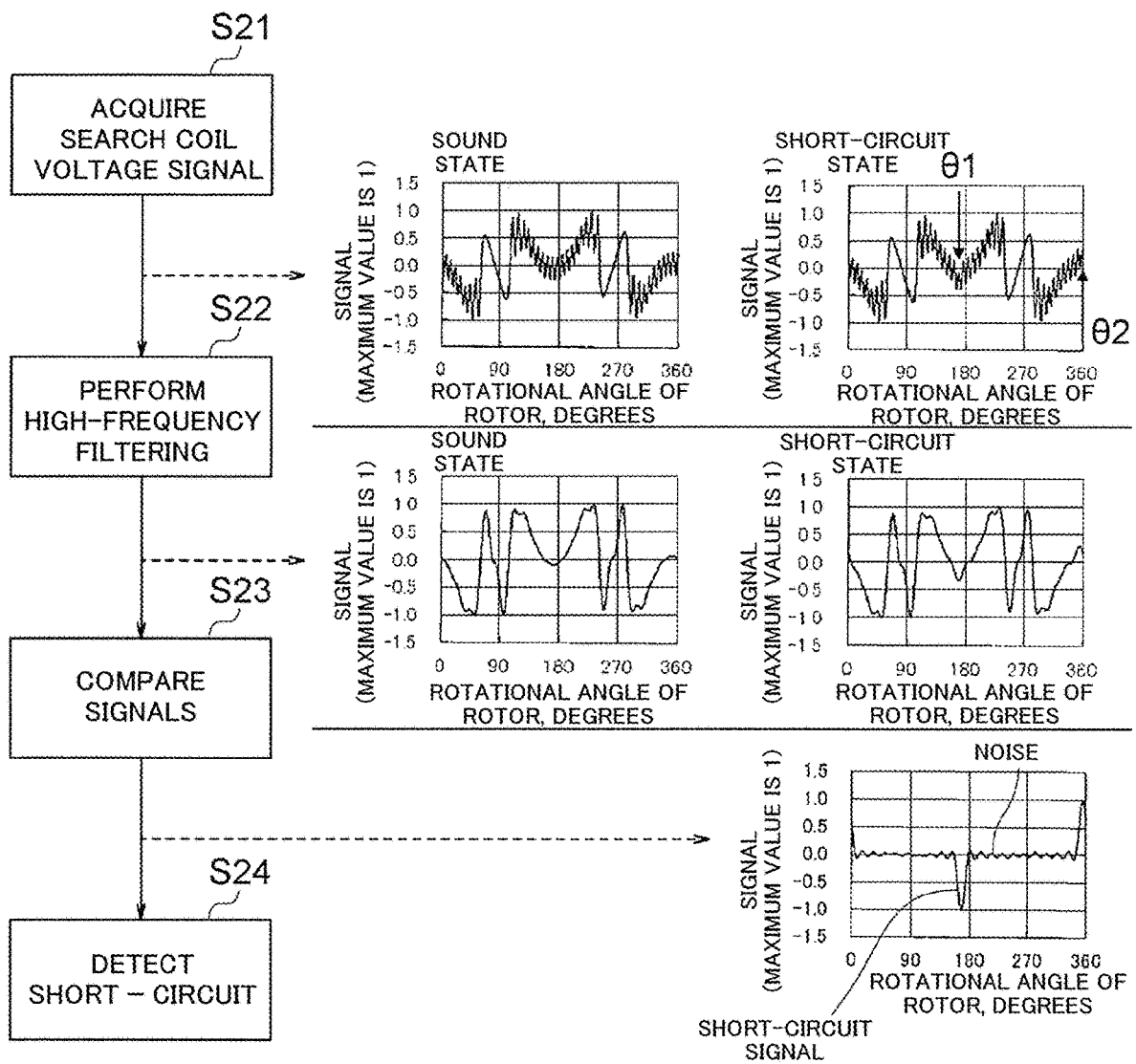
FIG. 8 is a flow chart for illustrating short-circuit detection processing in the first embodiment of the present invention.

Next, with reference to FIG. 8, description is given of short-circuit detection processing in the first embodiment. FIG. 8 is a flow chart for illustrating the short-circuit detection processing in the first embodiment of the present invention. In FIG. 8, examples of waveforms of the search coil voltage signals obtained after the processing of respective steps are illustrated together. Further, FIG. 8 shows each of a search coil voltage signal corresponding to a sound state in which no short circuit has occurred in the field winding 13, and a search coil voltage signal corresponding to a short-circuit state in which a short circuit has occurred in the field winding 13. Further, it is assumed that a short circuit corresponding to one turn of the field winding 13 has occurred in the rotor slot 12 corresponding to each of the rotational angle θ1 and the rotational angle θ2.

As illustrated in FIG. 8, in Step S21, the signal acquisition unit 101 of the short-circuit detection device 100 acquires the search coil voltage signal from the search coil 24 as a detection signal corresponding to the magnetic flux. After that, the processing proceeds to Step S22.

In Step S22, the signal processing unit 102 subjects the search coil voltage signal acquired in Step S21 to high-frequency filtering of removing at least one of main odd-order components of the rotor slot order components included in the search coil voltage signal. Subsequently, the signal processing unit 102 generates and outputs a filtered signal being the search coil voltage signal subjected to the high-frequency filtering. As a filter for performing the high-frequency filtering, a high-frequency filter designed so as to remove at least one of the main odd-order components of the rotor slot order components is used. After that, the processing proceeds to Step S23.

In Step S23, the signal processing unit 102 generates a short-circuit detection signal by subtracting the filtered signal in the sound state from the filtered signal output in Step S22, and outputs the short-circuit detection signal. After that, the processing proceeds to Step S24.

In Step S24, the short-circuit detection unit 103 detects the occurrence of the short circuit and the position of the rotor slot 12 at which the short circuit has occurred based on the feature of a peak or the like appearing in the short-circuit detection signal output in Step S23. After that, the processing is ended. As described above, the short-circuit detection unit 103 uses the filtered signal generated by the signal processing unit 102 to detect the short circuit of the field winding 13 of the turbine generator.

Figure 9:
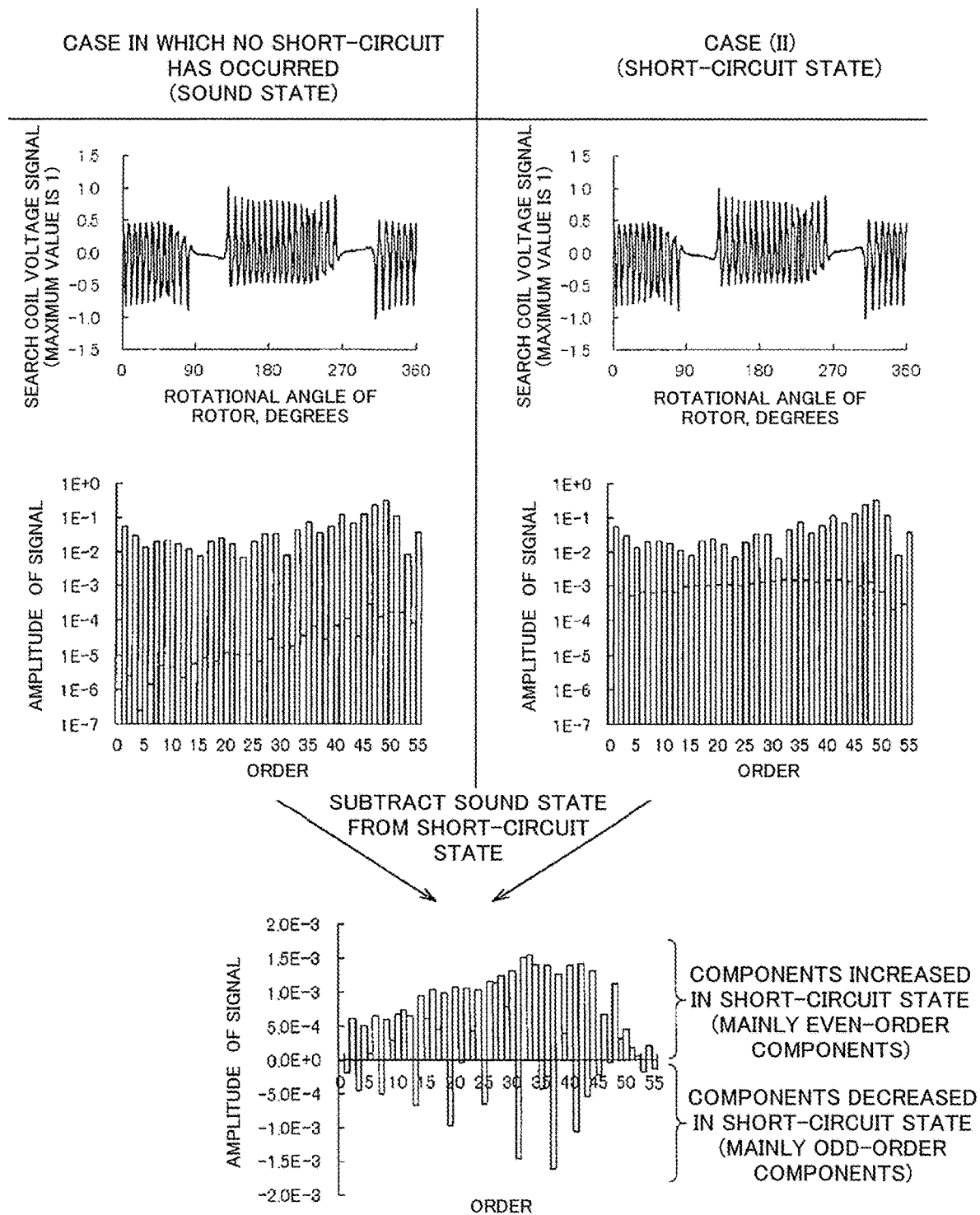
FIG. 9 shows graphs for showing frequency analysis results of the search coil voltage signal to be detected by a search coil in the first embodiment of the present invention.

Next, with reference to FIG. 9, description is given of a technical meaning of having the signal processing unit 102 configured to subject the search coil voltage signal to the above-mentioned high-frequency filtering in the first embodiment. FIG. 9 shows graphs for showing frequency analysis results of the search coil voltage signal to be detected by the search coil 24 in the first embodiment of the present invention. Here, the technical meaning is verified with reference to the waveforms of the search coil voltage signals corresponding to the sound state and the short-circuit state, that is, the case (II), respectively.

FIG. 9 shows the search coil voltage signals corresponding to the sound state and the short-circuit state, respectively, and frequency analysis results of the respective search coil voltage signals. As can be understood from FIG. 9, a result obtained when the field magnetic flux is reduced by an amount corresponding to one turn along with the occurrence of the short circuit is insignificant when the search coil voltage signals are compared with each other. This is because an effective number of turns which is several times of the number of short-circuit turns still remains in the same slot.

Meanwhile, as can be understood from FIG. 9, when the frequency analysis results are compared with each other, even-order components having orders smaller than the orders of the rotor slot order components are caused by the short circuit. This is because the main magnetic flux distribution is distorted by the short circuit, in other words, because the magnetic flux distribution in the air gap becomes asymmetric between the sound magnetic pole and the short-circuit magnetic pole. Those even-order components are smaller than the number of remaining turns corresponding to several hundred times. However, the even-order components have the same phase in the short-circuit slot, and hence have a large change at the short-circuit slot position when being integrated. This is the reason why it is selected to perform the high-frequency filtering of removing at least one of the main odd-order components of the rotor slot order components in order to selectively separate the low-frequency even-order components.

Figure 10:
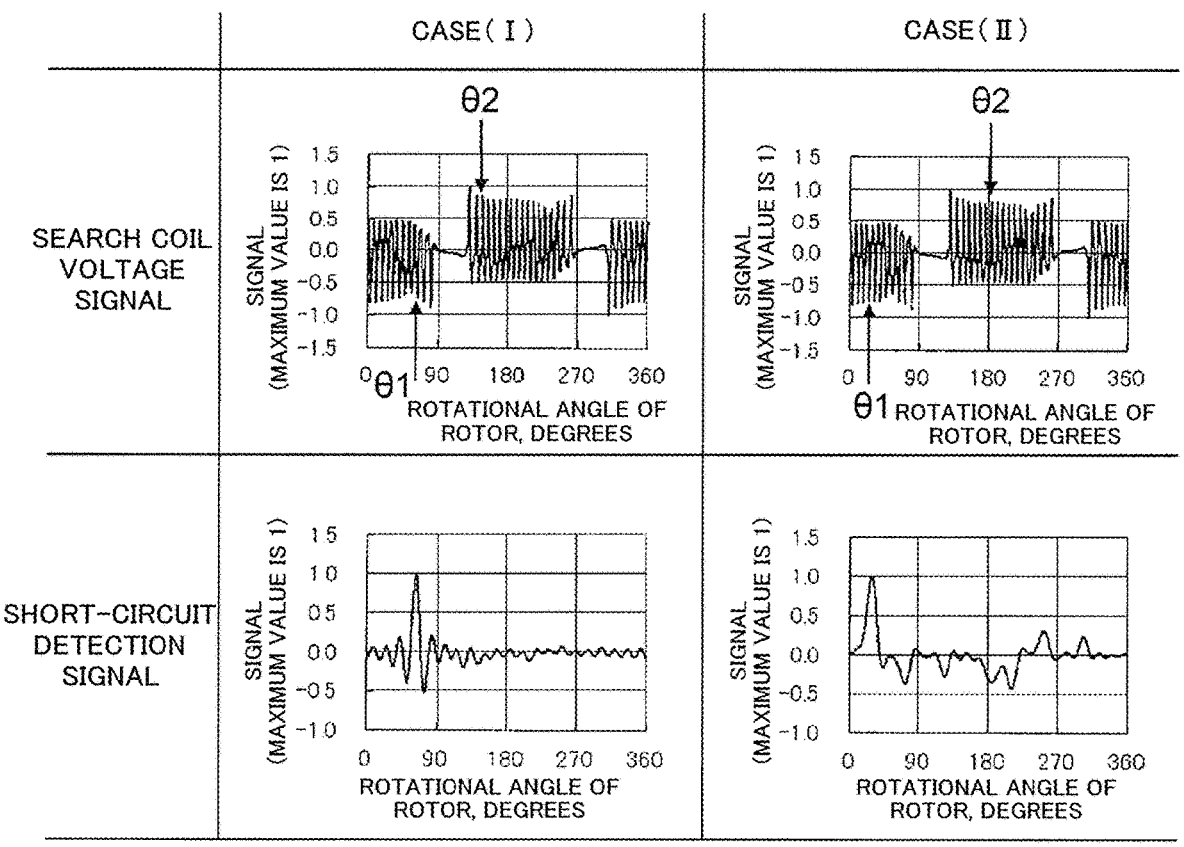
FIG. 10 shows waveform charts for illustrating the search coil voltage signal and the short-circuit detection signal to be obtained by the short-circuit detection processing in the first embodiment of the present invention.

Next, with reference to FIG. 10, description is given of results of a case in which the short-circuit detection processing in the first embodiment is performed on the search coil voltage signal to be detected in each of the case (I) and the case (II) illustrated in FIG. 7 above. FIG. 10 shows waveform charts for illustrating the search coil voltage signal and the short-circuit detection signal to be obtained by the short-circuit detection processing in the first embodiment of the present invention.

FIG. 10 shows examples of the search coil voltage signal and the short-circuit detection signal to be obtained in each of the case (I) and the case (II) similar to those of FIG. 7 above.

Further, as the condition of the high-frequency filtering performed on the search coil voltage signal, there is adopted a condition in which odd-order components having orders higher than the 24th order included in the search coil voltage signal are cut. The number "24" given as a specific numerical example of the order of the filter is a numerical value selected for convenience so that at least one component of the rotor slot order components included in the search coil voltage signal can be sufficiently cut. This condition is determined in consideration of the fact that the search coil voltage signal includes components which are caused by the armature reaction magnetic fluxes, and have the first order, and includes the rotor slot order components having the 47th and 49th orders. When the odd-order components having orders higher than the 24th order of the search coil voltage signal are cut, the rotor slot order components, that is, the rotor slot harmonics, can be sufficiently removed.

As can be understood from FIG. 10, it is apparent that, even in the condition of the case (II) in which the influence of the main magnetic fluxes is increased and thus it is difficult to grasp the magnetic flux reduction by an amount corresponding to one short-circuit turn, the short-circuit detection signal can be distinguished satisfactorily. The search coil 24 easily picks up measurement noise. Accordingly, the short-circuit detection signal having a large half width, which is obtained by the short-circuit detection processing in the first embodiment, can be easily distinguished from an impulse noise component. Therefore, the short-circuit detection processing in the first embodiment is an effective method capable of suppressing erroneous detection of the short circuit.

It is effective to apply the short-circuit detection processing in the first embodiment to, for example, a specification in which the number of turns of the field winding 13 wound around the rotor slots 12 is large, a specification in which the number of rotor slots 12 is large, or the like. Further, it is also effective to apply the short-circuit detection processing in the first embodiment to an operation condition of the turbine generator in which the main magnetic fluxes are generated, an operation condition of the turbine generator in which a field current becomes relatively smaller than a current flowing through the multi-phase winding 23, or the like. Still further, it is also effective to apply the short-circuit detection processing in the first embodiment to a case in which a short circuit occurs in the rotor slot 12 present in the vicinity of the direction in which the magnetic flux flows, a case in which the search coil 24 is arranged close to the rotor surface, a case in which high-frequency noise of a measuring device itself is large due to an ambient environment, or the like.

As described above, according to the first embodiment, the short-circuit detection device 100 includes the signal acquisition unit 101, the signal processing unit 102, and the short-circuit detection unit 103. The signal acquisition unit 101 is configured to acquire, from the search coil 24 being an example of the magnetic flux detector configured to detect the magnetic flux generated in the air gap between the rotor 10 and the stator 20 of the rotating electric machine, the search coil voltage signal being an example of the detection signal corresponding to the magnetic flux. Further, the signal processing unit 102 is configured to subject the detection signal acquired by the signal acquisition unit 101 to filtering of removing at least one component of the odd-order components of the rotor slot order components included in the detection signal, to thereby generate the filtered signal being the detection signal subjected to the filtering. Further, the short-circuit detection unit 103 is configured to detect the short circuit of the field winding 13 through use of the filtered signal generated by the signal processing unit 102. In this manner, the short circuit of the field winding 13 can be detected with high accuracy. Specifically, regardless of the specification of the rotor 10 of the rotating electric machine, the operation condition of the rotating electric machine, the position of the slot in which the short circuit has occurred, the arrangement position of the search coil, and the like, the short circuit of the field winding can be detected with high accuracy even under a condition in which the detection of the short circuit has been difficult so far because of large main magnetic fluxes and large rotor slot leakage magnetic fluxes generated by the remaining field winding.

Second Embodiment

Figure 11:
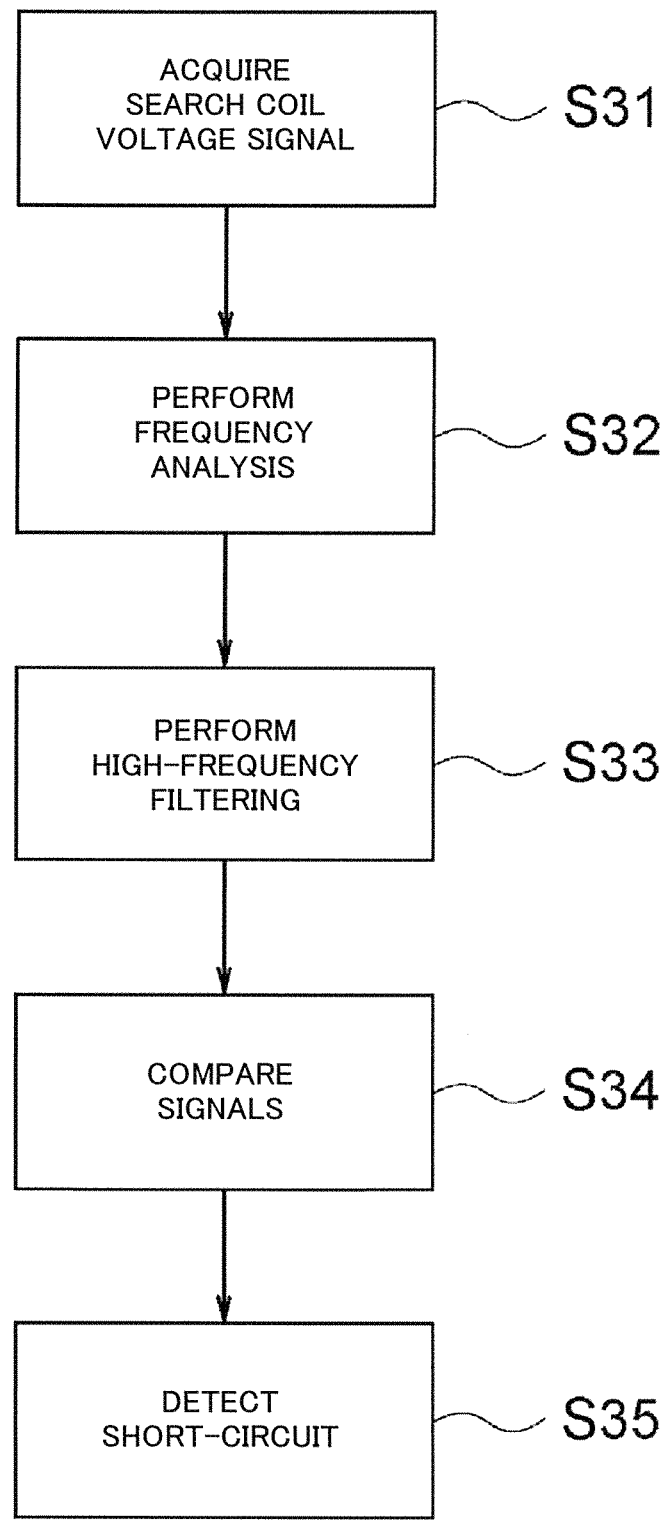
FIG. 11 is a flow chart for illustrating short-circuit detection processing in a second embodiment of the present invention.

The configuration of the short-circuit detection device according to the first embodiment described above may be modified as follows. FIG. 11 is a flow chart for illustrating short-circuit detection processing in a second embodiment of the present invention.

As illustrated in FIG. 11, in Step S31, the signal acquisition unit 101 of the short-circuit detection device 100 acquires the search coil voltage signal from the search coil 24 as the detection signal. After that, the processing proceeds to Step S32.

In Step S32, the signal processing unit 102 subjects the search coil voltage signal acquired in Step S31 to frequency analysis. After that, the processing proceeds to Step S33.

As described above, with the search coil voltage signal acquired in Step S31 being subjected to frequency analysis, even when the specification, for example, the number of turns of the field winding 13 of the turbine generator, is unclear, the orders of the rotor slot order components can be estimated from the main components. Further, in order to prevent erroneous detection of the short circuit, at least one of the odd-order components being a filter order capable of sufficiently separating the even-order components can be selected as appropriate. Further, through the frequency analysis, it can be determined which order component of the rotor slot order components is to be cut in the next step even without being designated by the user each time.

In Step S33, the signal processing unit 102 subjects the search coil voltage signal acquired in Step S31 to high-frequency filtering of removing at least one of main odd-order components of the rotor slot order components. Subsequently, the signal processing unit 102 outputs the search coil voltage signal subjected to the high-frequency filtering as a filtered signal. After that, the processing proceeds to Step S34. In this manner, the signal processing unit 102 subjects the detection signal to frequency analysis, and performs the filtering of removing at least one component of odd-order components included in the detection signal subjected to the frequency analysis.

In Step S34, the signal processing unit 102 generates a short-circuit detection signal by subtracting the filtered signal in the sound state from the filtered signal output in Step S33, and outputs the short-circuit detection signal. After that, the processing proceeds to Step S35.

In Step S35, the short-circuit detection unit 103 detects the occurrence of the short circuit and the position of the rotor slot 12 at which the short circuit has occurred based on the feature of a peak or the like appearing in the short-circuit detection signal output in Step S34. After that, the processing is ended.

Third Embodiment

The configuration of the short-circuit detection device according to the first embodiment described above may be modified as follows. In a third embodiment of the present invention, the rotation of the rotor 10 is used to detect the short-circuit slot through use of the detection signal of the short-circuit magnetic pole in which the short circuit of the field winding 13 has occurred and the detection signal of the sound magnetic pole in which no short circuit of the field winding 13 has occurred.

A first modification example of the present invention is as follows. That is, the signal acquisition unit 101 of the short-circuit detection device 100 uses the rotation of the rotor 10 to acquire, from the search coil 24, each of the detection signal of the sound magnetic pole and the detection signal of the short-circuit magnetic pole. Subsequently, the signal processing unit 102 subjects each of those two detection signals to high-frequency filtering, to thereby output two filtered signals. The short-circuit detection unit 103 compares the two filtered signals with each other, to thereby detect the short circuit of the field winding 13. In this manner, the signal processing unit 102 generates a delay signal obtained by delaying a current filtered signal by a phase of 180 degrees in an electrical angle. Further, the short-circuit detection unit 103 compares the current filtered signal and the delay signal with each other, to thereby detect the short circuit of the field winding 13.

A second modification example of the present invention is as follows. That is, the signal acquisition unit 101 of the short-circuit detection device 100 acquires, from the search coil 24, a current detection signal and a past detection signal which is continuous or non-continuous from the current detection signal. The signal processing unit 102 outputs a current filtered signal and a past filtered signal obtained by subjecting the current detection signal and the past detection signal to high-frequency filtering, respectively. The short-circuit detection unit 103 compares the two filtered signals with each other, to thereby detect the short circuit of the field winding 13. In this manner, the short-circuit detection unit 103 compares a current filtered signal with a past filtered signal which is continuous or non-continuous from the current filtered signal, to thereby detect the short circuit of the field winding 13.

A third modification example of the present invention is as follows. That is, in the two-pole rotating electric machine, two search coils 24 are fixed and mounted at positions of the air gap 30 opposed to each other by 180 degrees. The signal acquisition unit 101 of the short-circuit detection device 100 acquires two detection signals from the two search coils 24, respectively. The signal processing unit 102 subjects each of the two detection signals to high-frequency filtering, to thereby output two filtered signals. The short-circuit detection unit 103 compares the two filtered signals with each other, to thereby detect the short circuit of the field winding 13. In this manner, the signal acquisition unit 101 acquires the detection signal from each of the plurality of search coils 24 arranged at positions different from each other by a phase of 180 degrees or more in an electrical angle. Further, the short-circuit detection unit 103 compares filtered signals corresponding to respective detection signals generated by the signal processing unit 102 with each other, to thereby detect the short circuit of the field winding 13.

Fourth Embodiment

The configuration of the short-circuit detection device according to the first embodiment described above may be modified as follows. In a fourth embodiment of the present invention, when the field winding 13 is short-circuited with a contact resistance being zero, as in the above-mentioned electromagnetic analysis, a magnetic flux corresponding to one turn is reduced. When the contact resistance is not zero, the magnetic flux reduction amount is less than that corresponding to one turn. Moreover, the magnetic flux reduction amount is different even with the same short-circuit condition between a rated load state and an intermediate load state of the field current.

As in those examples, when a threshold value having a certain value is provided, the short-circuit detection may become difficult. The signal subjected to the above-mentioned filtering has a good SN ratio, and regardless of the magnitude of the absolute value thereof, the short-circuit detection signal is clear. Accordingly, any of the signal subjected to the filtering by the signal processing unit 102 or the short-circuit detection signal generated by the signal processing unit 102 is subjected to signal amplification. As described above, the signal processing unit 102 is configured to amplify the filtered signal. In this manner, the short circuit of the field winding 13 can be easily determined based on the SN ratio or the count number of the short-circuit detection signal. When at least one component of even-order components caused by the short circuit of the field winding 13 is amplified, the change caused by the short circuit can be emphasized with respect to the odd-order components.

The first to fourth embodiments have been described as examples of the present invention, but the present invention is not limited to the configurations of the first to fourth embodiments. Within the scope not deviating from the gist of the present invention, the configurations of the first to fourth embodiments can be combined as appropriate, or can be modified partially or omitted partially.

REFERENCE SIGNS LIST 10 rotor, 11 rotor core, 12 rotor slot, 13 field winding, 14 magnetic pole, 20 stator, 21 stator core, 22 stator slot, 23 multi-phase winding, 24 search coil, 30 air gap, 41 magnetic pole center direction, 42 inter-pole center direction, 100 short-circuit detection device, 101 signal acquisition unit, 102 signal processing unit, 103 short-circuit detection unit, 200 processor, 300 storage device

The invention claimed is:

1. A short-circuit detection device, comprising:
signal acquiring circuitry to acquire, from a magnetic flux detector configured to detect a magnetic flux generated in an air gap between a rotor and a stator of a rotating electric machine, a detection signal corresponding to the magnetic flux;
a signal processor to subject the detection signal acquired by the signal acquiring circuitry to high-frequency filtering designed so as to remove orders equal to or higher than a predetermined order including at least one component of odd-order components of rotor slot order components which are included in the detection signal, and correspond to orders of space harmonics of slots of the rotor, to thereby generate a filtered signal being the detection signal subjected to the high-frequency filtering; and
short-circuit detecting circuitry to detect a short circuit of a field winding of the rotating electric machine through use of the filtered signal generated by the signal processor, and specify a short-circuit position in a rotor slot based on the filtered signal,
wherein the signal processor is configured to subject the detection signal acquired by the signal acquiring circuitry to the high-frequency filtering designed so as to selectively remove a part of odd-order main components which are main components of the rotor slot order components included in the detection signal by removing the orders equal to or higher than the predetermined order, to thereby selectively separate and pass low-frequency even-order components.

2. The short-circuit detection device according to claim 1, wherein the signal processor is configured to subject the detection signal acquired by the signal acquiring circuitry to the high-frequency filtering of selectively removing a part of the odd-order main components of the rotor slot order components included in the detection signal, and passing the other components.

3. The short-circuit detection device according to claim 1, wherein the signal processor is configured to subject the detection signal to frequency analysis, and perform the high-frequency filtering of removing at least a part of odd-order components included in the detection signal subjected to the frequency analysis.

4. The short-circuit detection device according to claim 3, wherein the signal processor is configured to amplify at least a part of even-order components included in the detection signal subjected to the frequency analysis.

5. The short-circuit detection device according to claim 1, wherein the short-circuit detecting circuitry is configured to compare a current filtered signal with a past filtered signal which is continuous or non-continuous from the current filtered signal, to thereby detect the short circuit of the field winding.

6. The short-circuit detection device according to claim 1,
wherein the signal processor is configured to generate a delay signal obtained by delaying a current filtered signal by a phase of 180 degrees in an electrical angle, and
wherein the short-circuit detecting circuitry is configured to compare the current filtered signal and the delay signal with each other, to thereby detect the short circuit of the field winding.

7. The short-circuit detection device according to claim 1,
wherein the signal acquiring circuitry is configured to acquire the detection signal from each of a plurality of the magnetic flux detectors arranged at positions different from each other by a phase of 180 degrees or more in an electrical angle, and
wherein the short-circuit detecting circuitry is configured to compare filtered signals corresponding to respective detection signals generated by the signal processor with each other, to thereby detect the short circuit of the field winding.

8. The short-circuit detection device according to claim 1, wherein the signal processor is configured to amplify the filtered signal.

9. The short-circuit detection device according to claim 1, wherein the magnetic flux detector is configured to detect a magnetic flux in a radial direction.

10. A short-circuit detection method, comprising:
a signal acquisition step of acquiring, from a magnetic flux detector configured to detect a magnetic flux generated in an air gap between a rotor and a stator of a rotating electric machine, a detection signal corresponding to the magnetic flux;
a signal processing step of:
subjecting the detection signal acquired in the signal acquisition step to high-frequency filtering of removing high frequencies which is designed so as to selectively remove a part of odd-order main components which are main components of rotor slot order components being included in the detection signal, and corresponding to orders of space harmonics of slots of the rotor and to remove orders equal to or higher than a predetermined order including the selected at least one component, to thereby selectively separate and pass at least a first-order component and low-frequency even-order components; and generating a filtered signal being the detection signal subjected to the high-frequency filtering; and a short-circuit detection step of:

detecting a short circuit of a field winding of the rotating electric machine through use of comparison between a current filtered signal generated in the signal processing step and a past filtered signal which is continuous or non-continuous from the current filtered signal or a delay signal obtained by delaying the current filtered signal by a phase of 180 degrees in an electrical signal, or through use of amplification of at least a part of even-order components included in the filtered signal; and specifying a short-circuit position in a rotor slot based on the comparison between the current filtered signal and the past filtered signal which is continuous or non-continuous from the current filtered signal or the delay signal obtained by delaying the current filtered signal by the phase of 180 degrees in the electrical signal, or based on the amplification of the at least the part of the even-order components included in the filtered signal.

\* \* \* \* \*